United States Patent [19]
Pannell et al.

[11] Patent Number: 5,472,786
[45] Date of Patent: Dec. 5, 1995

[54] VARIABLE INDEX MATERIAL FOR OPTICAL SWITCHING AND REAL TIME HOLOGRAPHIC RECORDING

[75] Inventors: Keith H. Pannell; Jean Robillard, both of El Paso, Tex.

[73] Assignee: Board of Regents, The University of Texas System, Austin, Tex.

[21] Appl. No.: 308,856

[22] Filed: Sep. 19, 1994

[51] Int. Cl.$^6$ .................................................. B32B 9/04
[52] U.S. Cl. ................. 428/447; 427/163.2; 427/407.1; 427/553; 427/595
[58] Field of Search ................... 427/163.2, 553, 427/595, 407.1; 428/447

[56] References Cited

PUBLICATIONS

Bergh et al., "Single–Mode Fibre Optic Directional Coupler," *Electron Lett.*, 16:260–261, 1980. (no month available).
Fischer et al., "Derivatization of Surfaces via Reaction of Strained Silicon–Carbon Bonds. Characterization by Photoacoustic Spectroscopy," *Journal of the American Chemical Society*, pp. 6501–6506, 1979. (no month available).
Halperin, "Properties of a Particle in a One–Dimensional Random Potential," *Advances in Chemical Physics*, 13:123–177. (no date available).
Nguyen and Diaz, "High Molecular Weight Poly(ferrocenediyl–silanes): Synthesis and Electrochemistry of [—CH$_5$H$_4$)Fe(C$_5$H$_4$)SiR$_2$—]$_n$, R=Me, Et, n–Bu, n–Hex," *Chem. Mater.*, 5:(10):1389–1394, 1993. (no month available).

*Primary Examiner*—Bernard Pianalto
*Attorney, Agent, or Firm*—Arnold, White & Durkee

[57] ABSTRACT

A new variable index material is described which provides rapid changes in refractive index. The disclosed materials are useful for coatings and films that provide photosensitive materials for holographic recording with high efficiency. The materials are also useful for modulating the coupling ratio in fiber optic couplers for optical switching. The new materials incorporate polymeric dialkylsilane ferrocenylene and long chain fatty acids.

17 Claims, 14 Drawing Sheets

VARIABLE INDEX MATERIAL FOR OPTICAL SWITCHING AND REAL TIME HOLOGRAPHIC RECORDING

BACKGROUND OF THE INVENTION

The U.S. government owns rights in the present invention pursuant to grant No. RRII-0880-2973 awarded by the National Science Foundation.

FIELD OF THE INVENTION

The present invention relates generally to high efficiency variable index materials and, in particular, to materials used as special coatings on fiber optic couplers and as special emulsions for real time holographic recording. The rapidly changing indices of refraction of these materials permits the modulation of the coupling ratio of fiber optic couplers for optical switching. This property also contributes to the high efficiency of photosensitive compositions prepared for use in holographic recording.

DESCRIPTION OF THE RELATED ART

Reversible variable index materials with fast response are organic semiconductors involving a donor-acceptor mechanism. One of the first materials studied was poly(N-vinylcarbazole) doped with the acceptor trinitro-2,4,7-fluorenone-9 (TNF). Higher changes in refraction indices are now obtained with organometallic charge transfer complexes. Two classes of such complexes are complexes where (i) the metal is an integral part of the backbone of the molecule and (ii) the metal is part of a lateral group.

Examples of the first category are shown in FIG. 1A, FIG. 1B, FIG. 1C, FIG. 1D and FIG. 2. In metal phthalocyanines such as the one represented in FIG. 2, charge transfer takes place between the molecular groups through the ligands and the metal atoms. Electron transfer is improved if the ligand is conjugated and the chelate structure is planar.

Figure 1A:
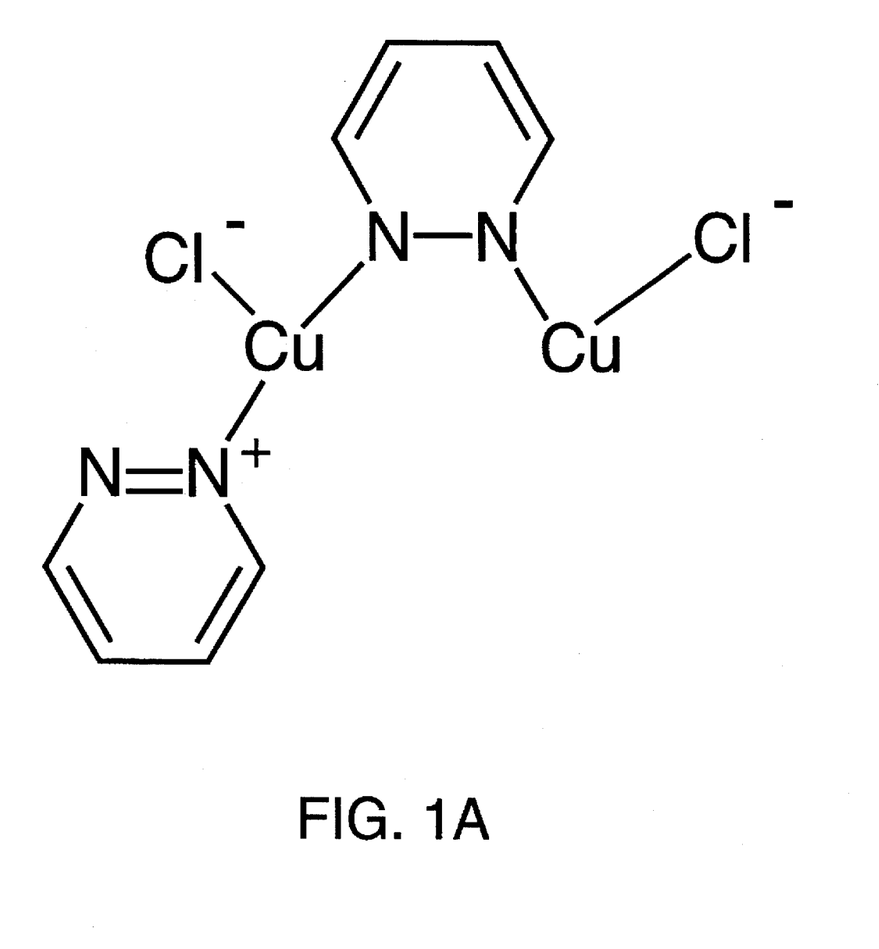
FIG. 1A. Example of an organometallic complex where the copper metal is an integral part of the molecule.
Figure 1B:
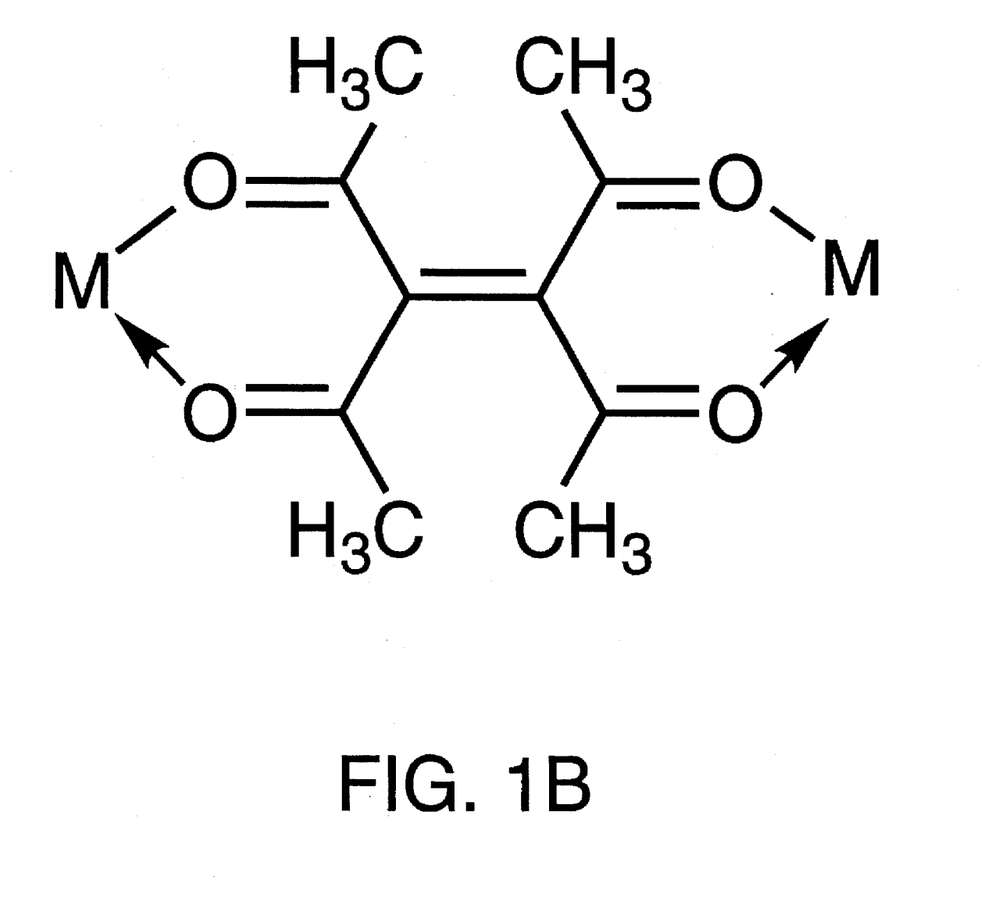
FIG. 1B. Example of an organometallic complex where the metal is an integral part of the molecule.
Figure 1C:
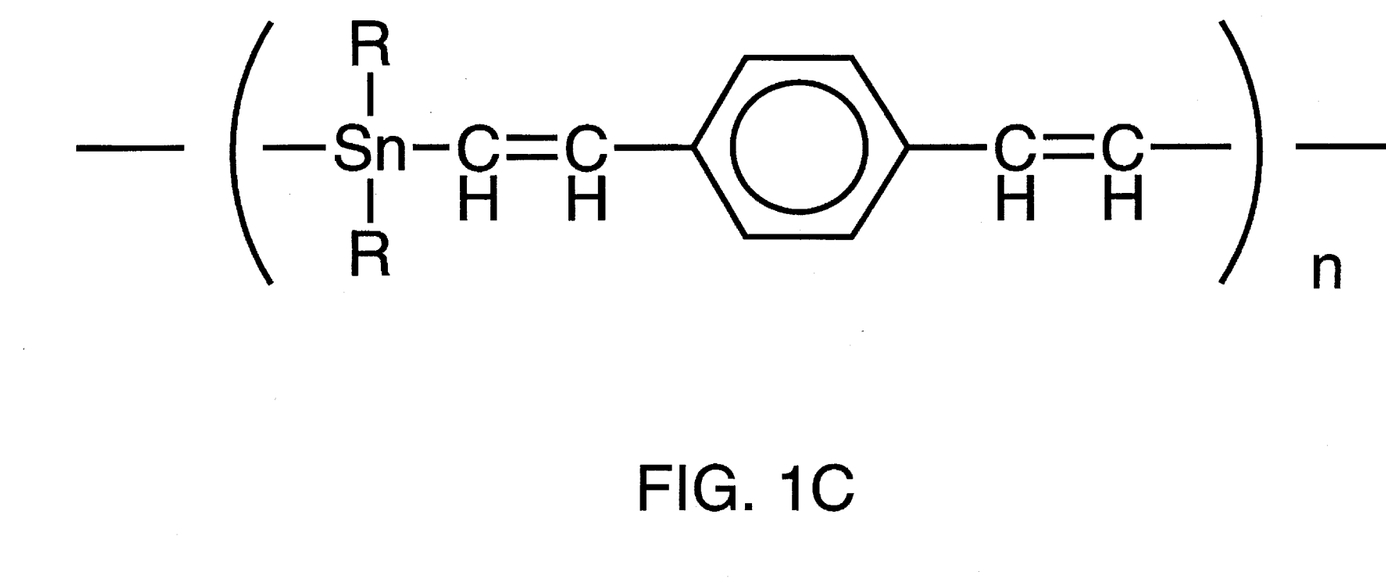
FIG. 1C. Example of an/organometallic complex where the tin metal is an integral part of the molecule.
Figure 1D:
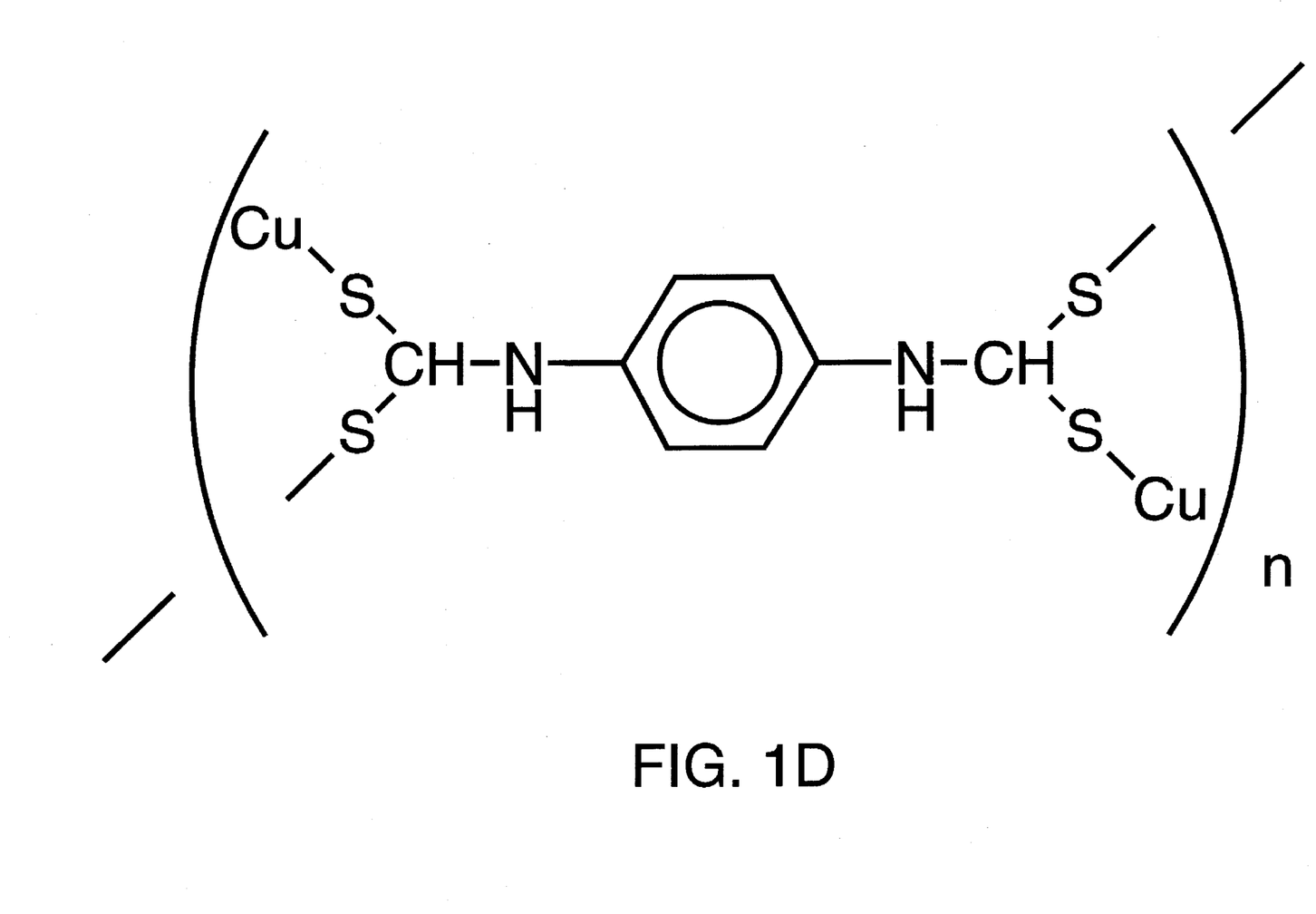
FIG. 1D. Example of an organometallic complex where the copper metal is an integral part of the molecule.
Figure 2:
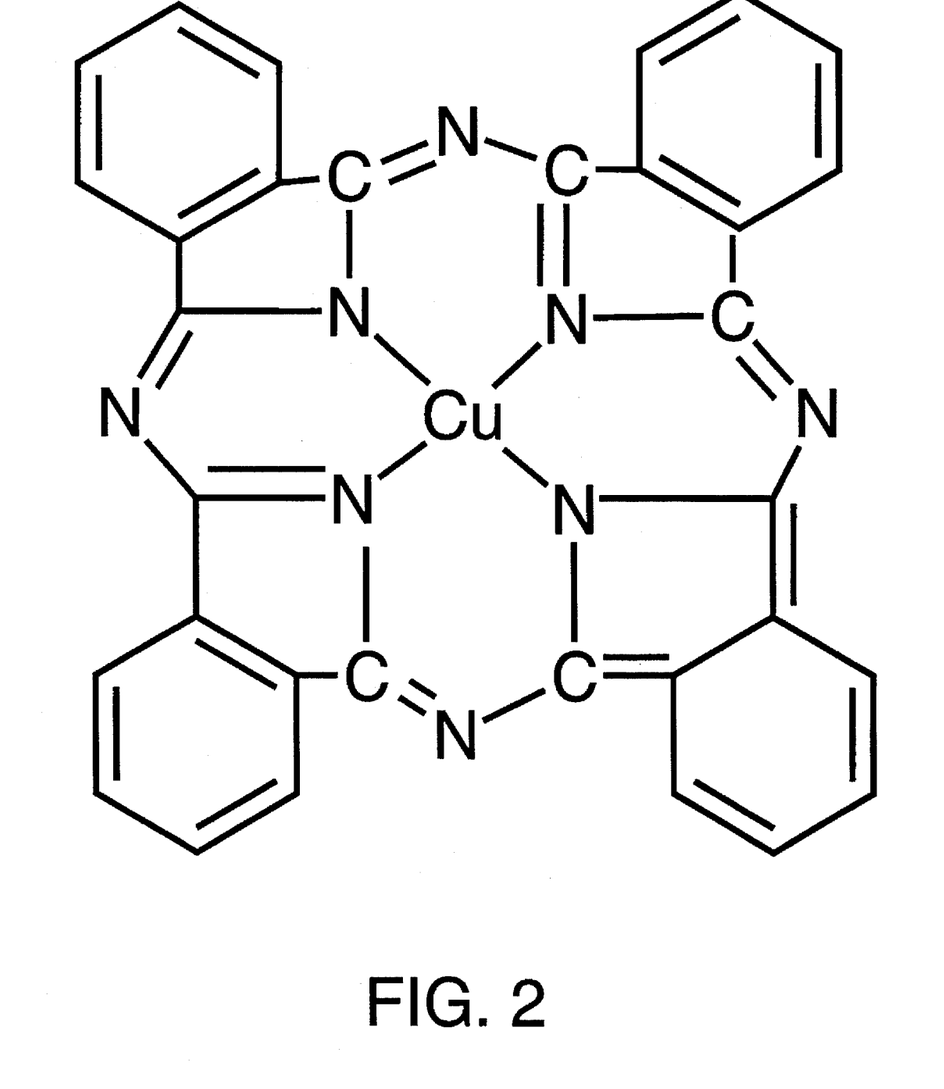
FIG. 2. Molecular structure of copper phthalocyanine.
Figure 3:
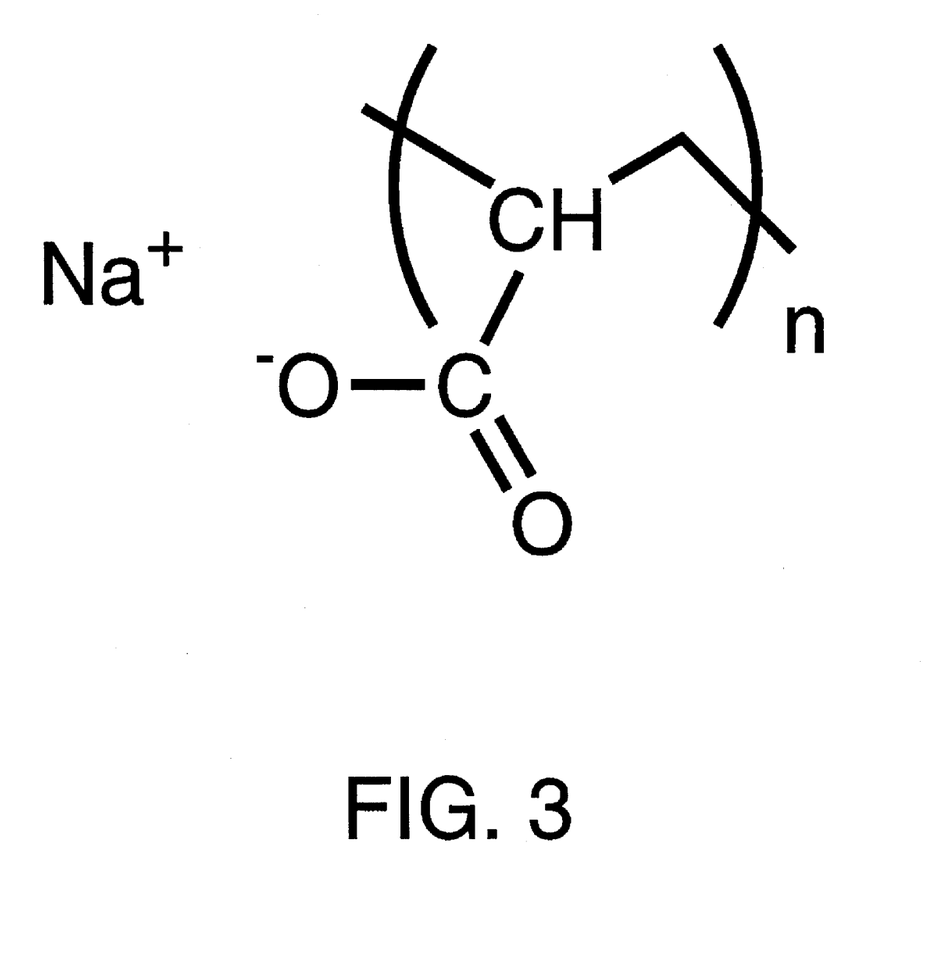
FIG. 3. Polyvinyl complex with monovalent ion.
Figure 4:
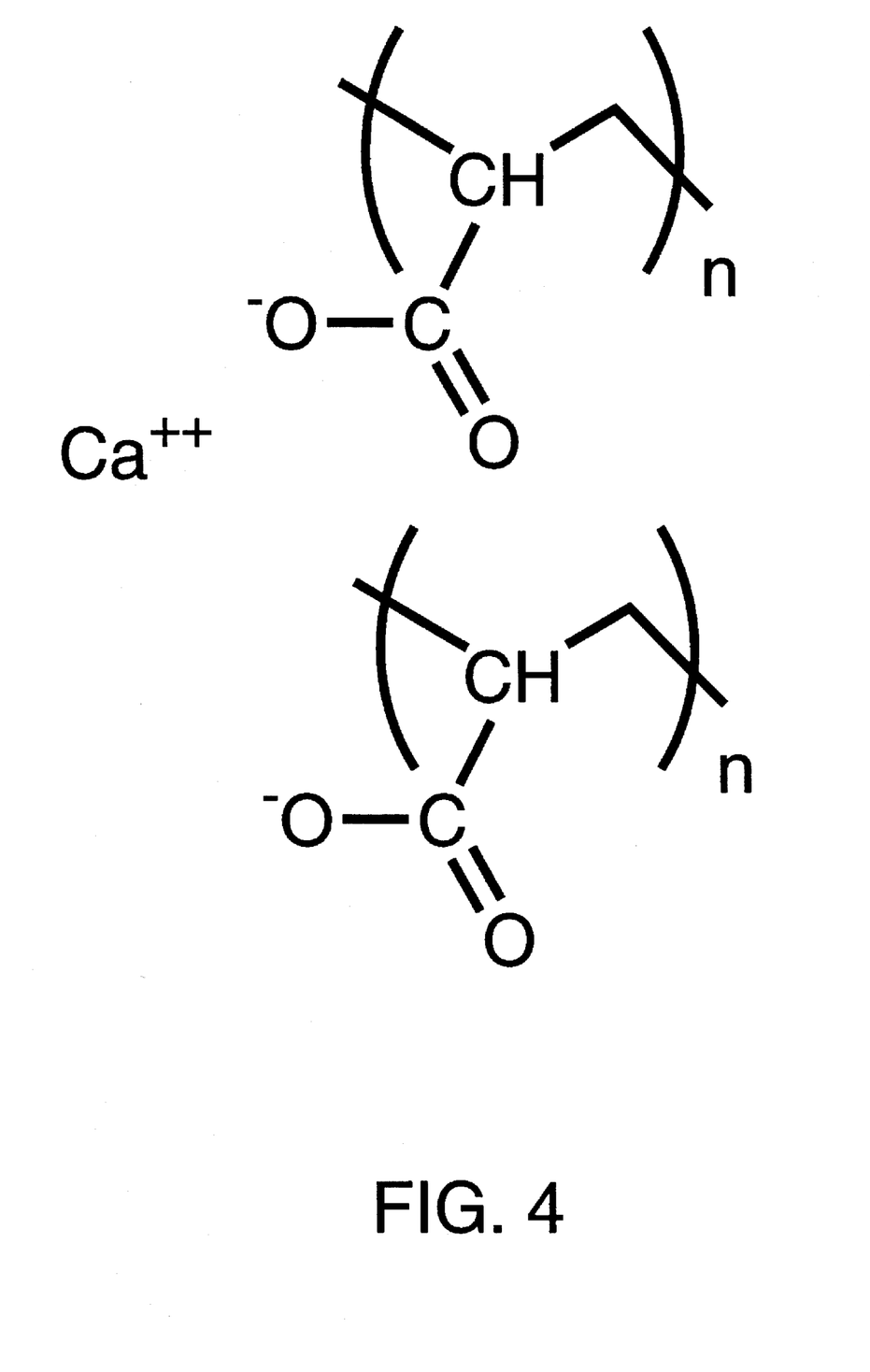
FIG. 4. Polyvinyl complex with divalent ion.
Figure 5:
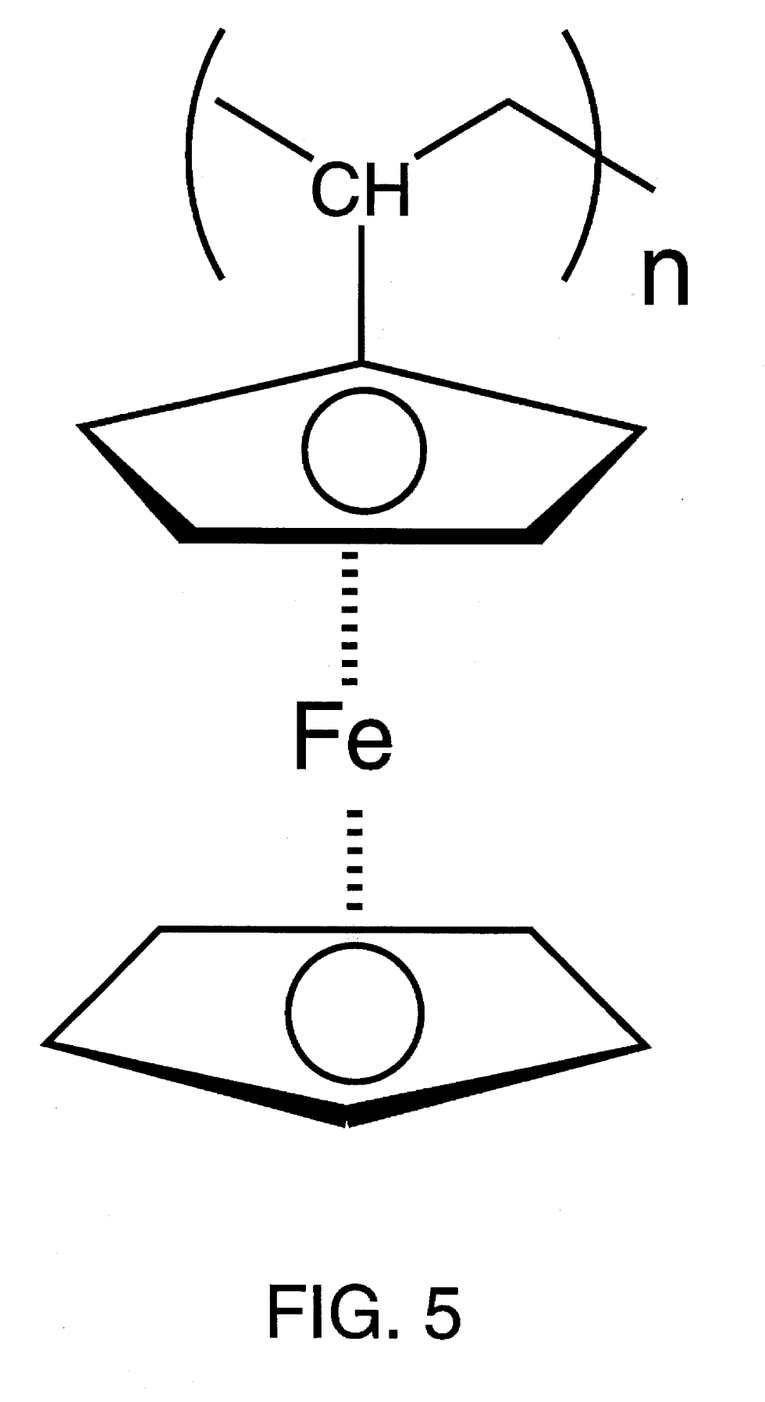
FIG. 5. Polyvinylferrocene.
Figure 6:
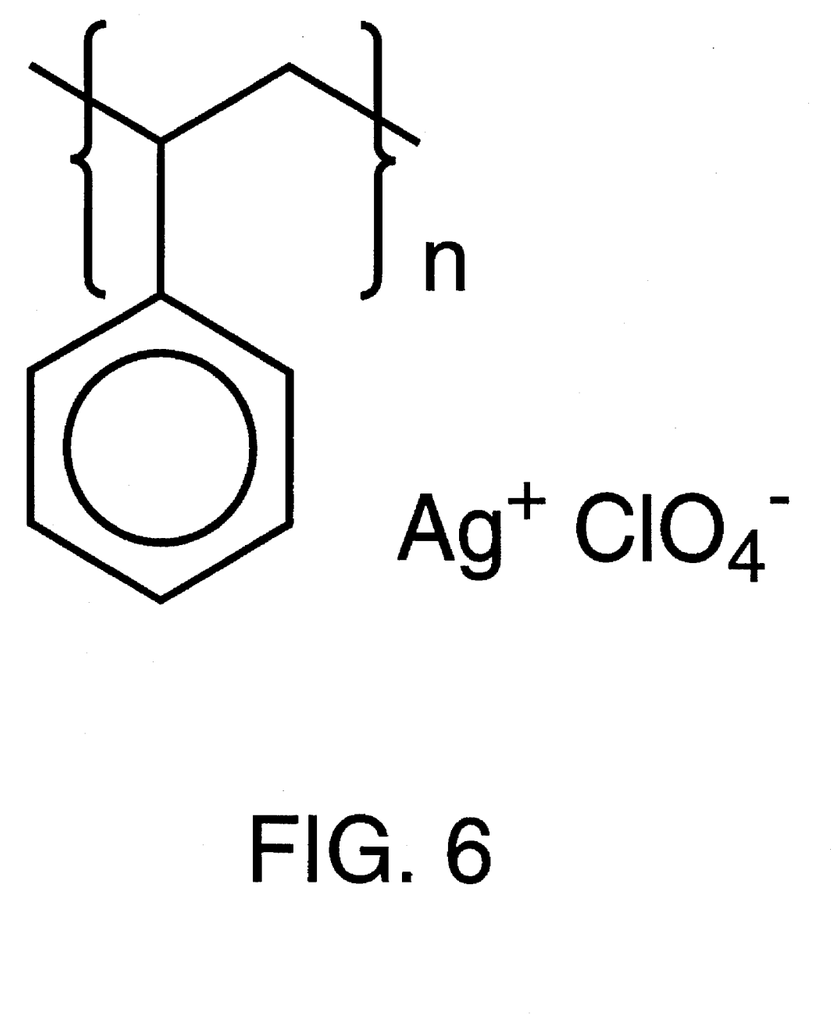
FIG. 6. Polystyrene complex.
Figure 7:
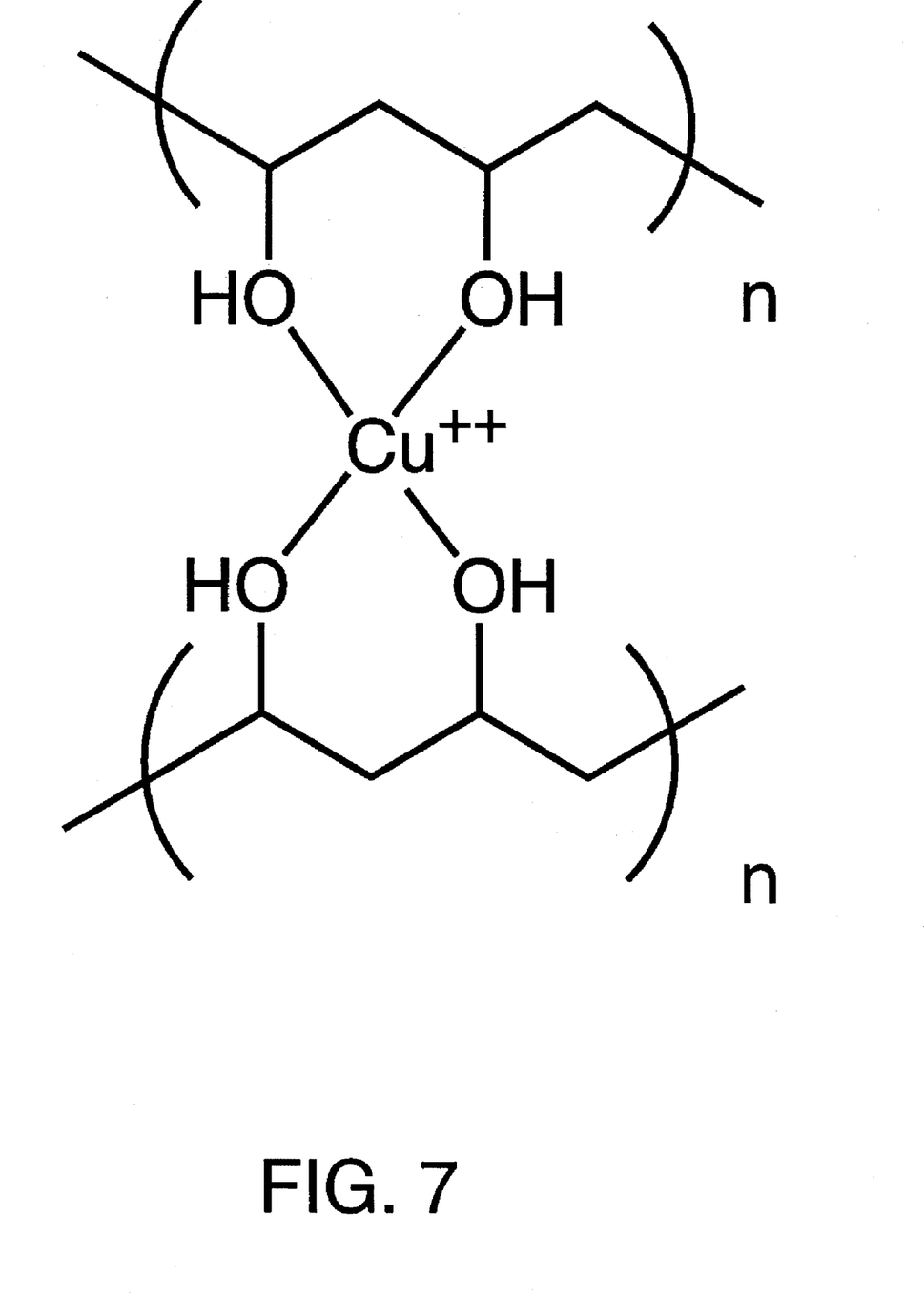
FIG. 7. Polyvinyl alcohol-Cu complex.
Figure 8A:
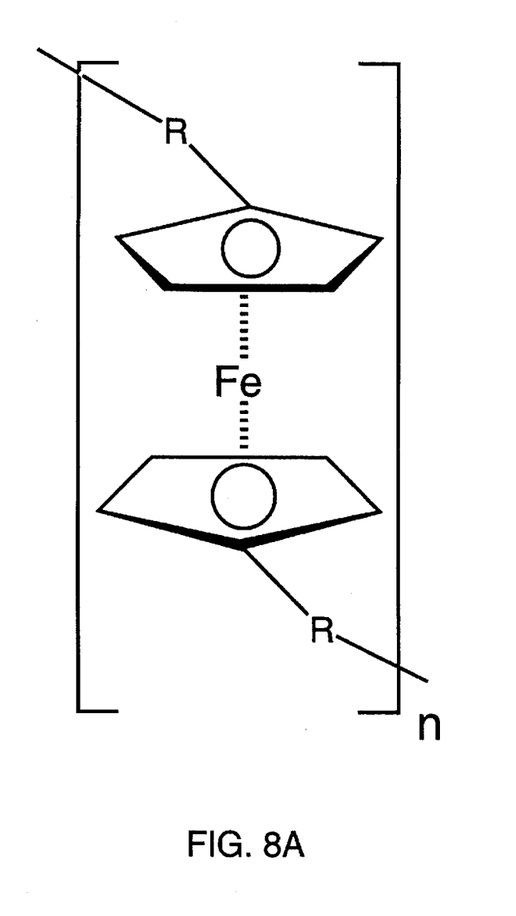
FIG. 8. Crosslinking in polyvinylferrocene.
Figure 8B:
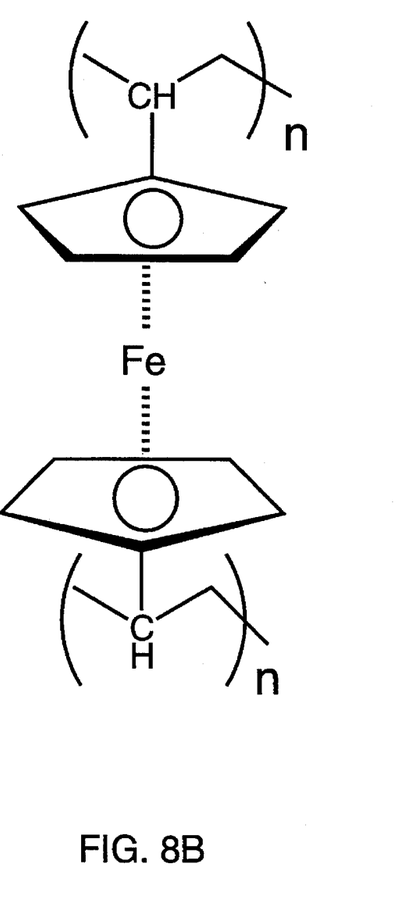

In the second class of variable index organic semiconductors, the metal may be in the form of an ion, as shown in FIG. 3 and FIG. 4; a π complex, as shown in FIG. 5 and FIG. 6; or bound to a chelating ligand, as shown in FIG. 7. Polymers with chelating lateral groups easily form coordination complexes with metal ions. Depending on the ionic charge and the coordination number of the metal ion, crosslinking may occur. This is the case for compounds such as polyvinylferrocene where the metal induced crosslinking is facilitated by the cyclopentadiene groups (See FIG. 8). In such complexes the hybrid orbitals of the metal atoms readily lose electrons and contribute to the donor part of the molecule. The electrons can be trapped at an impurity or a structural defect which additionally contributes to the index of refraction.

Figure 9A:
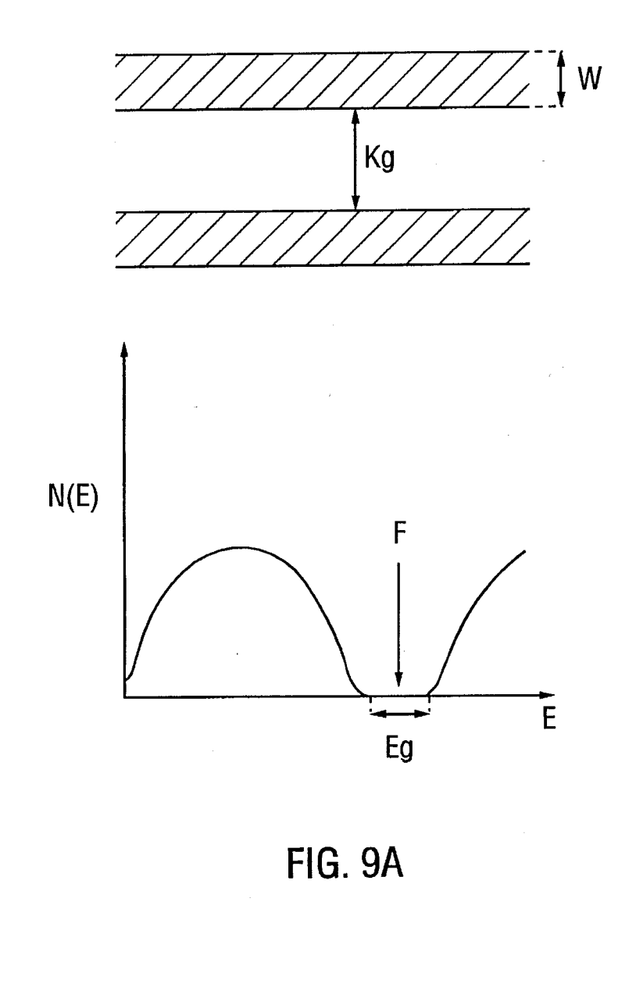
FIG. 9A. Organic semiconductor energy diagram showing conductance bands.
Figure 9B:
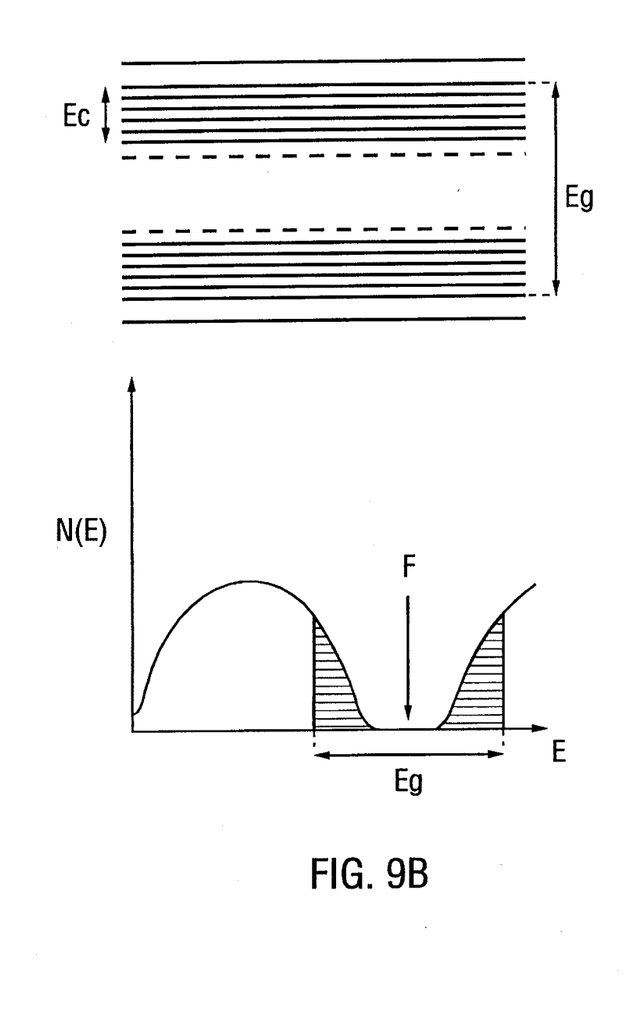
FIG. 9B. Organic semiconductor energy diagram showing valence bands.

Conduction in an organic semiconductor depends on localized states in the conduction band of the material (Halperin, 1967; Gutmann and Lyons, 1967). These states can extend into the band gap as shown in FIG. 9A and FIG. 9B. The lowest possible states are localized states but there is a critical energy $E_c$ above which the states do not become more localized. An electron can be promoted to a localized state in the conduction band either thermally, by photoelectric effect or by injection. Once in that state it is necessary to provide sufficient energy to displace the electron to another localized state. This energy can be thermal or photonic. The electron can also be transferred by a tunnel effect if the orbitals overlap. The localized states correspond to traps for electrons generated photolytically in the material, as represented in FIG. 9A and FIG. 9B.

A trapped electron can oscillate under the influence of a periodic field. The system trap-electron becomes an elementary dipole contributing to the dielectric constant and the index of refraction of the material. This contribution is proportional to the maximum displacement of the electron during the oscillation, which corresponds to the depth of the traps, $E_c$, and also to the density of the traps. The origin of the electron may be a donor group of the polymer; for example, the hybrid orbitals of the metal atom of a chelating group.

The change in index of refraction in an organic semiconductor can be evaluated from the electronic properties of the material (Robillard, 1990). Two cases are considered depending on whether the change is produced by free carriers or by trapped carriers.

In the case of free carriers, the relative change is equal to:

$$\frac{1}{\eta} = \Delta\eta \simeq \frac{\epsilon^2}{2v^2 \epsilon \pi m} \Delta N$$

where:

η: index of refraction

ε: permittivity

N: concentration of free electrons m: elementary mass of the electron e: elementary charge of the electron v: frequency of the light.

For trapped carriers the relative change is represented by:

$$\mathcal{V}_\eta \Delta\eta = 2\pi\alpha \bullet \Delta N$$

where:

N: density of the trapped carriers

α: electronic polarizability at optical frequency.

SUMMARY OF THE INVENTION

The present invention addresses problems inherent in the art by providing novel variable index materials with improved properties as compared to materials presently employed for analogous applications. The improvements include complete reversibility, faster response times, higher refraction index variations, and increased stability. The invention also includes coatings and films that generate variable refractive index patterns in response to an identical pattern of light distribution. The invention also addresses the fabrication of films for the recording of high efficiency holograms.

As used herein the term "radiation sensitive member" refers to a component that responds to light by the absorption of visible radiation to increase its refractive index within the bulk of the film. The radiation sensitive materials are essentially transparent and exhibit variations in refractive index in response to radiation.

Figure 10:
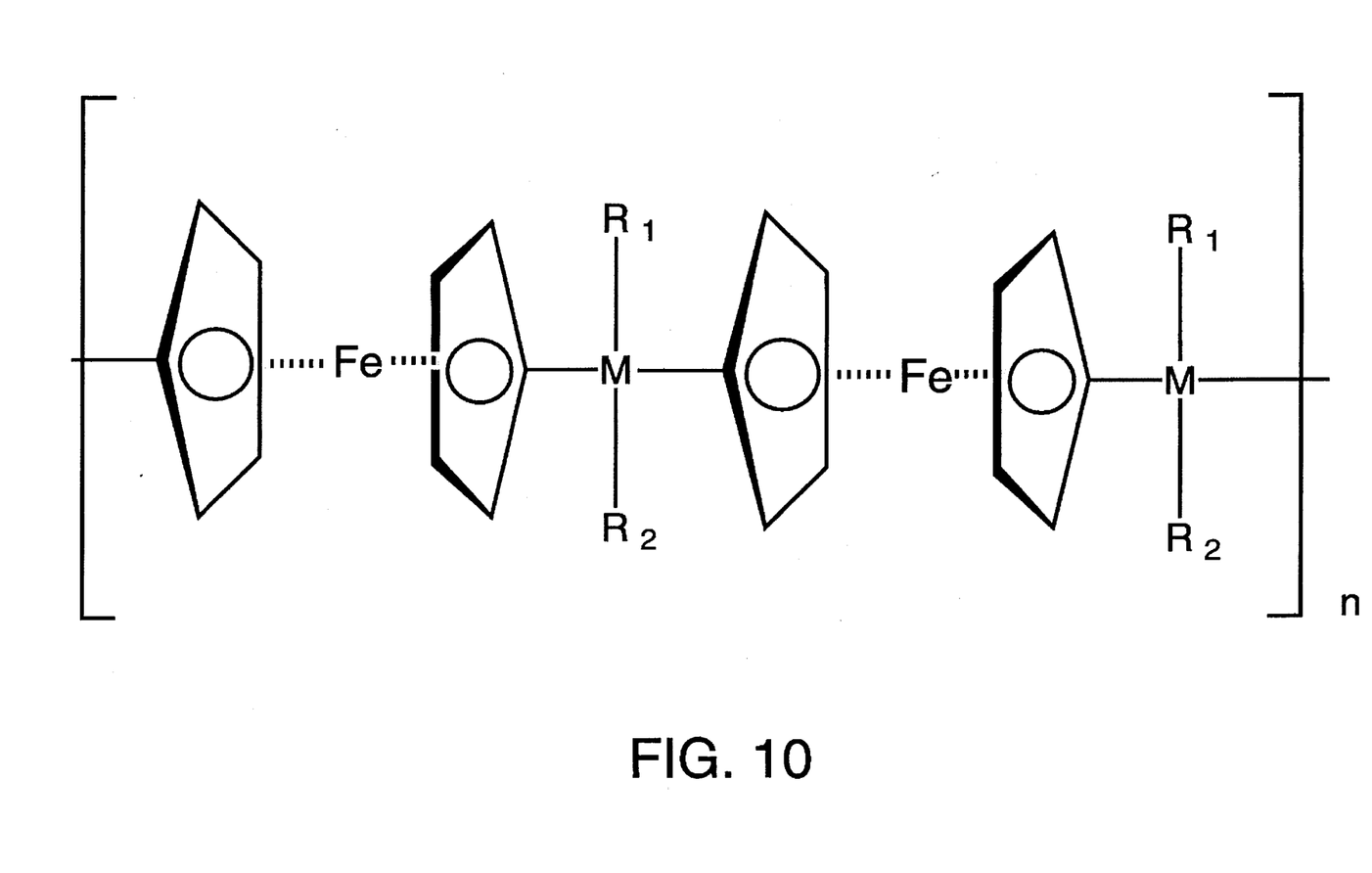
FIG. 10. Molecular structure of a disubstituted silane or germanium-ferrocenylene polymer where R is alkyl or aryl.

The inventors have developed novel variable index materials that incorporate polymeric disubstitued silicon or germanium ferrocenylene and long chain fatty acids. The ferrocenylene polymers employed in the practice of the present invention are polymers containing ferrocene groups linked together by disubstituted silyl or germanyl groups, as shown in FIG. 10. Examples of such polymers are poly-(dimethylsilane ferrocenylene), poly(diethylsilane ferrocenylene), poly(dibutylsilane ferrocenylene), poly(dihexysilane ferrocenylene), poly(methylphenylsilane ferrocenylene, the corresponding germanium analogs, and the like. Other substituents, such as branched chain alkyls, mixed alkyl and mixed aryl alkyl groups may also be used as substituents.

The inventors have achieved high efficiency holographic recording with photosensitive mono and multilayer films by combining a fatty acid with a substituted ferrocenylene as a mixed component and particularly with dialkylsilane ferrocenylene. The fatty acids are typically organic monobasic acids having the general formula $C_nH_{2n+1}COOH$ derived from saturated aliphatic hydrocarbons, such as eicosanoic acid, stearic acid, behenic acid, lauric acid, and the like.

The films are typically prepared from poly(ferrocenyl disubstituted silane or germane)/fatty acid mixtures spread in monolayers, conveniently by spreading on a subwater phase of a Langmuir Blodgett throw. For certain applications, such as holographic recording plates, each monolayer formed is removed and deposited on a transparent substrate to form a multilayer film.

A preferred embodiment of this invention is a radiation sensitive member having a dialkylsilane ferrocenylene polymer and fatty acid present as a number of Langmuir Blodgett layers. These layers may be prepared by conditioning the polymer and fatty acid composition into a film oriented by the Langmuir Blodgett method.

A number of films may need to be stacked to obtain maximum performance. It is preferred to have the number of Langmuir Blodgett layers between 20 and 100, with 20 layers being particularly preferred. When the film absorbs radiation (450 nm for the dimethylsilane-ferrocenylene polymer) a change in the index of refraction is initiated by a charge transfer mechanism. Films made from the dialkylsilane ferrocenylene polymers/fatty acids have provided high efficiency holographic recorders (on the order of 92% or greater).

The disclosed variable index materials have several applications, including holographic recording for real time recording. For example, films incorporating ferrocenyl dialkylsilane provide highly efficient holographic films. Such films are readily formed by Langmuir Blodgett methods, and then transferred to an appropriate transparent substrate. Multilayer films are the most efficient. The number of layers will vary depending on the particular disubstituted silane (or germanium) and fatty acid employed, although typically the number of layers will be between about 15 and about 40. The sensitivity and holographic efficiency of the recording materials is dependent on the transparency and variation of refractive index of the composition.

Figure 11:
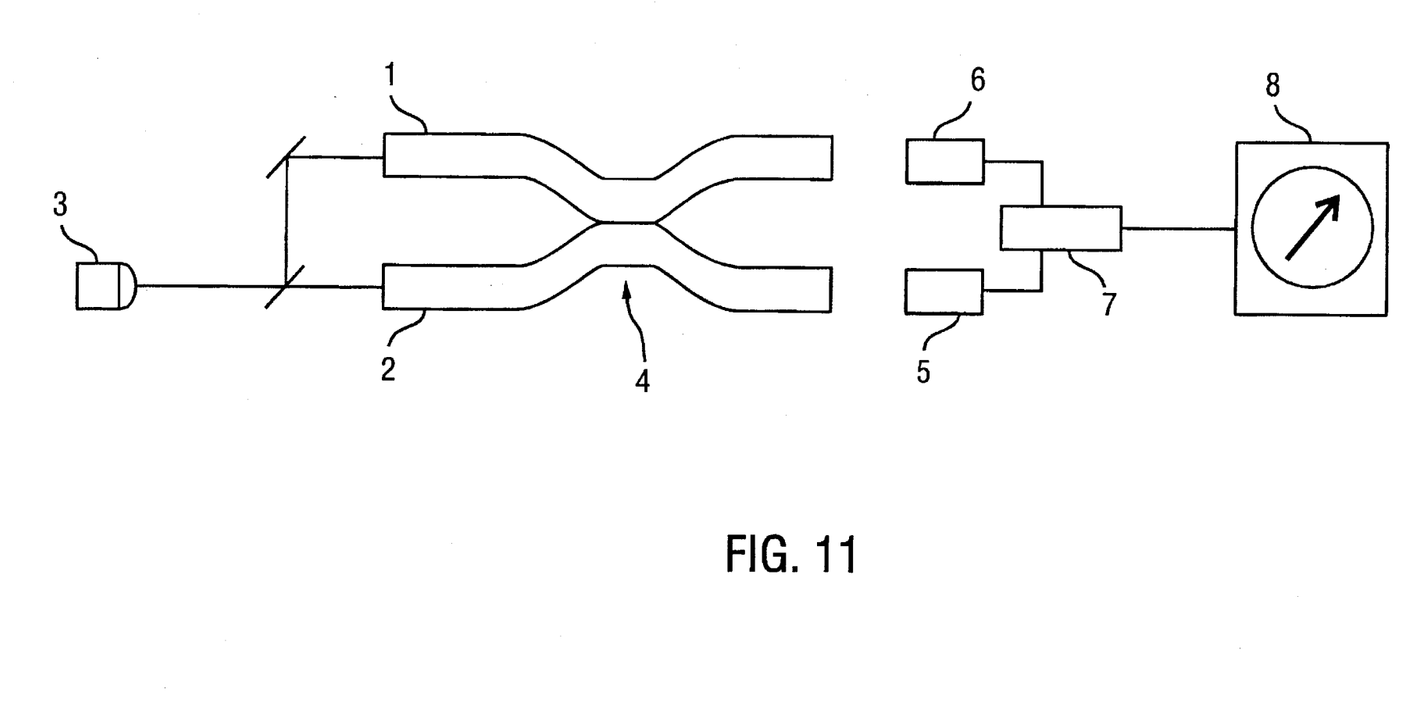
FIG. 11. Fiber optic coupler. Shown at number 1 is fiber 1; shown at number 2 is fiber 2; shown at number 3 is LED; shown at number 4 is VIM; shown at number 5 is photodiode 2; shown at number 6 is photodiode 1; shown at number 7 is Diff. amplifier; shown at number 8 is meter.

Other uses of the disclosed films include optical switches. Such switches can be made of a fiber optic coupler with variable index material surrounding the coupling area, as illustrated in FIG. 11. A sufficient change in index of refraction induced by irradiation of the material causes the light signal in fiber 1 to switch to fiber 2 with a switching time in the picosecond range.

In a particular embodiment of the invention, a fiber optical coupler is comprised of two optical fibers coated with a radiation sensitive member. The two optical fibers may be brought in close proximity to each other so that the evanescent fields of their signals overlap and part of the signal in one fiber is transmitted to the other (Bergh et al., 1980).

Another aspect of the present invention is a process for switching optical signals by exposing a fiber optical coupler to light; and switching the light signal from one fiber of the coupler to the other. The excitation by exposure to light provides the change of index of refraction necessary to transfer the optical signal from one fiber to the other. The coupling ratio, that is, the amount of signal transferred from one fiber to the other, is dependent on the index of refraction of the material surrounding the coupling region. If this index varies under the influence of light, it is then possible to switch the transmission of a signal from one fiber to the other. The switching speed depends on the response of the variable index material and, with the new materials disclosed in this invention, is on the order of a few picoseconds.

Yet another aspect of the invention encompasses a process for recording phase holograms by coating a transparent substrate with the radiation sensitive compounds and holographically exposing the film to radiation. Combining dialkylsilane ferrocenyl polymers with fatty acids, for example, provides a material for making holographic recording plates that allow high efficiency holographic recording. A film of the polymer is oriented by the Langmuir Blodgett method and transferred to the holographic substrate.

The high efficiency recording of phase holograms (Bragg holograms) can be made using local variations in refractive index alone, in the absence of any concurrently introduced optical absorption. In visual observation, under normal lighting, the recorded film is completely transparent.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION OF PREFERRED EMBODIMENTS

The variable index materials of the present invention are compounds of the general structure shown in FIG. 10. The compounds are formed from polymerization of disubstituted silane or disubstituted germane ferrocenylene.

The photosensitive materials of the present invention are useful in the preparation of holographic films for high efficiency and real time holography. The optical properties of poly (ferrocenyl diatkylsilane), for example, allow the design of variable index materials with unusually high refractive index variations on the order of $10^{-2}$ that are useful for real time holographic recording. While not wishing to be limiting in terms of explanation, the inventors suspect that the high refractive index variations of the disclosed materials may be due to a donor-acceptor interaction in the molecule where the hybrid orbitals of the metal atoms (Fe and Si or Ge) easily lose electrons that contribute to the donor part of the molecule and the photoconduction of the material. These electrons may be trapped as the acceptor part of the molecule, as an impurity or as a structural defect such as an unsaturated monomer link, providing an additional contribution to the dielectric constant and the refractive index of the material. The introduction of various substituents in the monomer may determine the index of refraction and the magnitude of its variation.

A holographic recording member or film is made of several layers of one of the disclosed ferrocenyl polymers and a fatty acid formed by the Langmuir Blodgett method and deposited on a transparent substrate. Holograms recorded on such holographic recording members, for example members prepared from dialkylferrocenyl polymers, have a diffraction efficiency over 99%.

The variable index materials of the present invention may also be employed in optical switches. An optical switch may be made of a fiber optic coupler with the variable index material surrounding the coupling area, as shown in FIG. 11. A sufficient change in index of refraction induced by irradiation of the material causes the light signal in fiber 1 to switch to fiber 2 with a switching time in the picosecond range.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are now described.

The following examples are provided for purposes of clarification and should not be considered as limiting. One skilled in the art would recognize in light of the present disclosure that although the specified materials and conditions are important in practicing the invention, unspecified materials and conditions are not excluded as long as they do not prevent the benefits of the invention from being realized.

EXAMPLE 1

Synthesis of Poly(dimethylsilane ferrocenylene)

1,1'-dimethylsilylferrocenophane. A slurry of 1,1'-dilithioferrocene-tetramethylethylene diamine (8 g, 0.025 mol) in hexane (20 ml) was added to a solution of dimethyldichlorosilane (3.1 ml, 0.026 mol) in hexane (100 ml). The reaction mixture was stirred overnight. Hexane and excess silane were removed under vacuum. The solids were dissolved in hexane and the solution filtered to remove LiCl. The solvent was again removed under vacuum and the product was extracted from the residue by vacuum sublimation (0.01 mm, 40° C.) to form orange platelets. The yield was 60% (mp 72.75° C., $\lambda_{max}$ (hexane) 478 mm (Fisher et al., 1979).

Poly(dimethylsilane ferrocenylene), poly($FCSiMe_2$). 1,1'-dimethylsilyl-ferrocenophane (1.0 g, 4.72 mmol) was sealed in vacuuo in a pyrex tube (1 cm×6 cm) and heated at 125° C. for 6 hours. The reaction product, an amorphous glass solid, was dissolved in benzene and precipitated from hexane. The precipitate was collected by filtration and dried in vacuuo. This procedure yielded 0.65 g (65%). The polymer was characterized by $^1H$, $^{13}C$, $^{29}Si$ NMR and UV spectroscopy. A similar procedure was used for synthesis of polymers with the ethyl, n-butyl, n-hexyl, mixed phenyl/methyl and ferrocenyl groups (Nguyen et al., 1993).

EXAMPLE 2

Synthesis of Poly(dibutylsilane ferrocenylene)

$(n-C_4H_9)_2SiCl_2$ (3.4 g, 16 mmol) in hexane (10 ml) was stirred overnight with 1,1'-dilithioferrocene-tetramethylethylene diamine. The reaction mixture was filtered and solvent was removed in vacuo. The distillation of the resulting liquid (138° C., 05 mm Hg) resulted in the isolation of a liquid fraction (1.78 g) that solidified slowly at room temperature. The solid contained a mixture of 1,1'-di-n-butylsilyl ferroceneophane (yield 35%) and a glassy solid dark red residue. The residue was washed twice with hexane, dissolved in benzene and the polymeric product was precipitated from hexane. The polymeric product was filtered and vacuum dried to yield 0.8 g (18%).

EXAMPLE 3

Ferrocenylene compounds with germanium in place of silicon were synthesized. The following example is illustrative of the procedure. Other disubstituted germanes may be synthesized by a similar procedure.

Synthesis of Poly(diethyl)germanium Ferrocenylene

To a mixture of ferrocene (3.0 g, 16 mmole) and TMEDA (5 mL, 33 mmole) dissolved in hexane (60 mL) was slowly added a solution of n-butyllithium in hexanes (22 mL of a 1.6 M solution). After about 2 hrs an orange precipitate formed and the system was left stirring for 12 hrs. The precipitate was washed with hexanes until essentially colorless, and 50 mL of hexane added, cooled to −78° C. and the mixture was stirred. To this stirred system was added $Et_2GeCl_2$ (3.23 g, 16 mmole in 5 mL hexane) over a 2 hr period. The stirred solution was lsowly raised to room temperature and stirred overnight. The reaction mixture was filtered and the solvent removed under vacuum to leave red-brown crystals. No attempt was made to isolate this material, which was then dissolved in 20 mL of toluene and heated in a sealed tube to 105° C. for 10 days. The toluene was removed under vacuum, and the polymeric residue was dissolved in THF (10 mL) and precipitated by addition of methanol (300 mL) to form the polymer as a yellow solid. Anal for $C_{14}H_{18}FeGe$ (Galbraith Laboratories): Calcd. %C, 53.17, %H, 5.74. Found: %C, 52.82, %H, 5.81. NMR, $C_6D_6$, ppm: $^1H$: 4,315, 4,146, 1,30, 1,10. $^{13}C$: 73.30, 72.83, 71.07, 9.875, 7.405.

EXAMPLE 4

Langmuir Blodgett Films

An 0.1 mM solution of poly(ferrocenyl dibutylsilane) and 0.17 mM eicosanoic acid in dichloromethane was spread on a subwater phase of a Langmuir Blodgett throw. The subphase contained $1.22 \times 10^{-3}$ M cadmium chloride. The Langmuir layer was formed at a constant surface pressure of 25 mN/m at 10 mm per min. It was then transferred onto a glass substrate that was previously treated with octadecyltrichlorosilane in chloroform. This operation was repeated 20 times thereby producing a 20-layer film. The film was exposed to radiation at 450 nm. A variation of index of $2.6 \times 10^{-2}$ was measured on an ellipsometer (Gaertner L108B) for a nominal value of the refraction index of $n=1.72$. Diffraction efficiency of 92% with a spatial frequency of 3000 $mm^{-1}$ was obtained on the reconstruction of a diffraction grating.

Measurement of the refractive index was made on an ellipsometer Gaertner type L1043 with the substrate positioned in such a way that the direction of dipping (orientation of the substrate perpendicular to the air-water interface during deposition) was parallel to the plane of incidence in the ellipsometer.

Indices of $n=1.15$ for layers of poly(dimethylsilane ferrocenylene)-Eicosanoic acid with variations $\Delta n=2 \times 10^{-2}$ and $n=1.96$ for layers of poly(dibutylsilane ferrocenylene)-eicosanoic acid with variations $\Delta n=2 \times 10^{-2}$ were measured on 20 layer films. The measurements were made at $\lambda=632.8$ (HeNe) and the variations were obtained with 50 microsecond pulses at 450 nm.

Films made with other (poly) disubstituted silane ferrocenyl and poly(disubstituted germanium ferrocenyl compounds were obtained in a manner similar to that described. The films had similar properties to those of poly(dibutylsilane ferrocenylene)-eicosanoic acid.

While the compositions and methods of this invention have been described in terms of preferred embodiments, it will be apparent to those of skill in the art that variations may be applied to the systems, compositions, methods and in the steps or in the sequence of steps of the methods described herein without departing from the concept, spirit and scope of the invention. For example, it will be apparent that certain agents which are chemically, compositionally and functionally related may be substituted for the agents described herein where the same or similar results may be achieved. All such similar substitutes and modifications apparent to those skilled in the art are considered to be within the spirit, scope and concept of the invention as defined by the appended claims.

REFERENCES

The following references, to the extent that they provide exemplary procedural or other details supplementary to those set forth herein, are specifically incorporated herein by reference.

Bergh et al. (1980) *Electron Lett.*, 16:260–261.
Fisher et al. (1979) *J. Am. Chem. Soc.*, 101(22):6501.
Gutmann and Lyons (1967) *Organic Semiconductors*, Wiley, New York.
Halperin (1967) *Advances in Chemical Physics*, 13:123.
Nguyen et al. (1993) *Chem. Mater.*, 5:1389–1394.
Robillard (1990) in *Industrial Application of Holography*, Robillard and Caulfield Ed., Oxford University Press, New York, 136.

What is claimed is:

1. A radiation sensitive member comprising a fatty acid and a disubstituted silane ferrocenylene polymer or a disubstituted germane ferrocenylene polymer having the structure of FIG. 10 wherein $R_1$ and $R_2$ are independently alkyl, aryl or ferrocenyl wherein said member absorbs visible radiation to increase refractive index of said member.

2. The radiation sensitive member of claim 1 wherein the alkyl is methyl, ethyl, propyl, isopropyl, n-butyl, n-hexyl, mixed phenyl/alkyl or ferrocenyl groups.

3. The radiation sensitive member of claim 1 wherein the aryl is phenyl or mixed aryl/alkyl.

4. The radiation sensitive member of claim 1 wherein the radiation is between 400 and 800 nm.

5. The radiation sensitive member of claim 1, wherein the disubstituted silane ferrocenylene polymer is poly(dimethylsilane ferrocenylene), poly(diethylsilane ferrocenylene), poly(dibutylsilane ferrocenylene), or poly(dihexysilane ferrocenylene).

6. The radiation sensitive member of claim 1 wherein the disubstituted germane ferrocenylene polymer is poly (dimethyl germane ferrocenylene), poly (diethyl germane ferrocenylene), poly (dibutyl germane ferrocenylene) or poly (dihexyl germane ferrocenylene).

7. The radiation sensitive member of claim 1 wherein the fatty acid is a long chain fatty acid.

8. The radiation sensitive member of claim 1, wherein the fatty acid is eicosanoic, stearic, behenic, or lauric acid.

9. The radiation sensitive member of claim 1 wherein the fatty acid is eicosanoic acid.

10. The radiation sensitive member of claim 1, wherein the fatty acid is mixed with the disubstituted silane or germane ferrocenylene polymer.

11. The radiation sensitive member of claim 1, wherein the fatty acid is covalently bound to the disubstituted silane or germane ferrocenylene polymer.

12. The radiation sensitive member of claim 1, wherein the disubstituted silane ferrocenylene polymer and the fatty acid comprise one to about 100 Langmuir Blodgett layers.

13. The radiation sensitive member of claim 12 wherein the number of said Langmuir Blodgett layers is between about 10 and about 100.

14. The radiation sensitive member of claim 12 wherein the number of said Langmuir Blodgett layers is about 20.

15. A process for switching optical signals comprising the steps of:
   (a) coating an optical fiber coupling region with a monolayer or several monolayer film prepared from a fatty acid and a disubstituted silane or germane ferrocenylene polymer having the structure of FIG. 10 wherein $R_1$ and $R_2$ are independently alkyl, aryl or ferrocenyl; and
   (b) exposing the coated coupling region to visible light to produce variations in refractive index wherein optical signals are switched from one to the other optical fiber.

16. A process for recording phase holograms comprising the steps of:
   (a) coating a transparent substrate with a monolayer or several monolayer film prepared from a fatty acid and a disubstituted silane or germane ferrocenylene polymer having the structure of FIG. 10 wherein $R_1$ and $R_2$ are independently alkyl, aryl or ferrocenyl; and
   (b) holographically exposing said member to visible radiation to produce variations in refractive index in exposed areas of the member.

17. A phase hologram obtainable by the process of claim 16.

* * * * *